(12) United States Patent
Komai et al.

(10) Patent No.: US 9,269,742 B2
(45) Date of Patent: Feb. 23, 2016

(54) COVER GLASS FOR SEMICONDUCTOR PACKAGE AND PRODUCTION METHOD THEREOF

(75) Inventors: Takako Komai, Shiga (JP); Takashi Murata, Shiga (JP); Masahiro Yodogawa, Shiga (JP)

(73) Assignee: NIPPON ELECTRIC GLASS CO., LTD., Otsu-shi, Shiga (JP)

( * ) Notice: Subject to any disclaimer, the term of this patent is extended or adjusted under 35 U.S.C. 154(b) by 0 days.

(21) Appl. No.: 13/821,622

(22) PCT Filed: Sep. 8, 2011

(86) PCT No.: PCT/JP2011/070480
§ 371 (c)(1),
(2), (4) Date: Mar. 8, 2013

(87) PCT Pub. No.: WO2012/033161
PCT Pub. Date: Mar. 15, 2012

(65) Prior Publication Data
US 2013/0165312 A1   Jun. 27, 2013

(30) Foreign Application Priority Data
Sep. 9, 2010   (JP) .................... 2010-201630

(51) Int. Cl.
| | |
|---|---|
| C03C 3/091 | (2006.01) |
| C03C 3/087 | (2006.01) |
| C03C 3/085 | (2006.01) |
| H01L 27/146 | (2006.01) |
| C03C 1/00 | (2006.01) |

(52) U.S. Cl.
CPC ............ *H01L 27/14683* (2013.01); *C03C 1/00* (2013.01); *C03C 3/085* (2013.01); *C03C 3/087* (2013.01); *C03C 3/091* (2013.01); *H01L 27/14618* (2013.01); *H01L 2924/0002* (2013.01)

(58) Field of Classification Search
CPC ........ C03C 3/083; C03C 3/085; C03C 3/087; C03C 8/24; H01L 27/14683
USPC .......................................... 501/15, 66, 69, 70
See application file for complete search history.

(56) References Cited

U.S. PATENT DOCUMENTS

| | | | | |
|---|---|---|---|---|
| 4,309,507 | A * | 1/1982 | Davis et al. | 501/21 |
| 6,528,444 | B1 * | 3/2003 | Kondoh et al. | 501/70 |
| 6,534,346 | B2 * | 3/2003 | Kosokabe | 438/127 |
| 6,713,418 | B2 * | 3/2004 | Kishimoto et al. | 501/70 |
| 6,727,198 | B1 * | 4/2004 | Hashimoto et al. | 501/66 |
| 6,949,485 | B2 * | 9/2005 | Nakashima et al. | 501/69 |
| 7,170,154 | B2 | 1/2007 | Hachitani | |
| 8,647,995 | B2 * | 2/2014 | Aitken et al. | 501/69 |
| 2002/0001881 | A1 | 1/2002 | Kosokabe | |
| 2002/0193233 | A1 * | 12/2002 | Kishimoto et al. | 501/69 |
| 2003/0124774 | A1 | 7/2003 | Kosokabe | |
| 2009/0197088 | A1 * | 8/2009 | Murata | 428/410 |
| 2009/0217706 | A1 * | 9/2009 | Weber et al. | 65/106 |
| 2010/0209685 | A1 * | 8/2010 | Weber et al. | 428/220 |
| 2011/0014475 | A1 * | 1/2011 | Murata | 428/410 |
| 2011/0017297 | A1 * | 1/2011 | Aitken et al. | 136/260 |
| 2012/0251743 | A1 * | 10/2012 | Amin et al. | 428/34.4 |

FOREIGN PATENT DOCUMENTS

| | | | |
|---|---|---|---|
| CN | 1323753 | A | 11/2001 |
| JP | 7215734 | * | 8/1995 |
| JP | H07-215734 | A | 8/1995 |
| JP | 2002-358626 | A | 12/2002 |
| JP | 2004-238283 | A | 8/2004 |
| JP | 2004-327978 | A | 11/2004 |
| JP | 2005-162600 | A | 6/2005 |
| JP | 2005-200289 | A | 7/2005 |
| JP | 2008-013421 | A | 1/2008 |
| JP | 2008-115071 | A | 5/2008 |
| JP | 2009-057271 | A | 3/2009 |
| JP | 2009-084076 | A | 4/2009 |
| JP | 2010-116276 | A | 5/2010 |
| JP | 2010-168233 | A | 8/2010 |

OTHER PUBLICATIONS

International Search Report mailed Dec. 6, 2011 for PCT/JP2011/070480.
Office Action dated Sep. 29, 2014 for Chinese Application No. No. 201180043719.8.
Notification of Reasons for Refusal issued Dec. 15, 2014 in Japanese Patent Application No. 2011-194600 (5 pages) and English Translation (9 pages).
Notification of Reasons for Refusal issued Aug. 25, 2015 in Japanese Patent Application No. 2011-194600 (9 pages) with an English Translation (7 pages).

* cited by examiner

*Primary Examiner* — Karl Group
(74) *Attorney, Agent, or Firm* — Drinker Biddle & Reath LLP

(57) ABSTRACT

A cover glass for semiconductor package having thermal expansion coefficient conformable to plastic packages and allowing accurate detection of existence of foreign substances, dusts, etc. in an imaging test always having a low emission amount of alpha-ray, and a related production method. The cover glass comprises, in terms of percentage by mass, of from 58 to 75% of $SiO_2$, of from 1.1 to 20% of $Al_2O_3$, of from 0 to 10% of $B_2O_3$, of from 0.1 to 20% of $Na_2O$, of from 0 to 11% of $K_2O$, and of from 0 to 20% of alkaline earth metal oxide. The cover glass has average thermal expansion coefficient of from 90 to $180 \times 10^{-7}/°$ C. in the temperature range of from 30 to 380° C., a Young's modulus of 68 GPa or more, and an emission amount of alpha-ray from the glass of 0.05 $c/cm^2 \cdot hr$ or less.

19 Claims, No Drawings

COVER GLASS FOR SEMICONDUCTOR PACKAGE AND PRODUCTION METHOD THEREOF

FIELD OF THE INVENTION

The present invention relates to a cover glass for semiconductor package which is fixed to the front face of a semiconductor package holding a solid-state image sensing device or a laser diode not only to protect the solid-state image sensing device or the laser diode but to be used as a light-transparent window, and particularly to a cover glass for a plastic package holding a solid-state image sensing device such as a complementary metal oxide semiconductor (CMOS).

BACKGROUND OF THE INVENTION

Charge coupled device (CCD) and complementary metal oxide semiconductor (CMOS) are optical semiconductors that are commonly used as a solid-state image sensing device today. The CCD has been mainly used in video cameras for capturing high-definition images, but the accelerating use of data processing for image has recently broaden the scope of its usage rapidly. Particularly, they are commonly included in digital still cameras or cell phones to convert high-definition images into electronic information data. The CMOS, also called "complementary metal oxide semiconductor", has advantages as follows. That is, it can be smaller and consumes as little as about one-fifth the power in comparison with CCD. Further, it can be produced by using a microprocessor production process, which leads to less cost for facility and lower production cost. Thus, it is more frequently included in image input devices, such as cell phones or small personal computers.

The solid-state image sensing device is disposed in the semiconductor package made of a ceramic or metal material, such as alumina, or a plastic material, and hermetically sealed by bonding a sheet type cover glass which functions as a light transmissive window with an adhesive consisting of any kind of organic resin or low melting point glass.

The cover glass for semiconductor package is required to have a low emission of alpha-ray, because high emission amount of alpha-ray from the cover glass results in soft errors. The emission of alpha-ray from the glass results from the radioisotopes, such as of uranium (U) or thorium (Th), contained as impurities in the glass. Thus, during the glass production, measures such as using high-purity raw materials, or using refractories (e.g., alumina electrocast refractories, quartz refractories, platinum) with low content of radioisotopes for the inner wall of the melting furnace are taken.

Recently, along with the spread of digital cameras or cell phones, the demand for lightweight and compact high-pixel imaging systems and space-saving of the members are increasing. Thus, the package materials are becoming smaller and thinner. Further, plastic packages are attracting attention with a view to making the whole member lightweight.

Such being the case, the patent document 1 discloses a cover glass for semiconductor package having a thermal expansion coefficient conformable to plastic packages and a low emission amount of alpha-ray.

CITATION LIST

Patent Document

Patent Document 1: JP-A 2004-327978

SUMMARY OF THE INVENTION

Problems to be Solved By the Invention

The CCDs or CMOSs need to convert images into digital information accurately and thus the cover glass used therefore is required to have high level of cleanliness to meet strict standards in regard to dirt, scratches or attachment of foreign substances, or the like, on the surface. Further, in addition to the surface cleanliness, preventing crystal defects or incidence of foreign substances such as platinum inside the glass is also required. Furthermore, such a kind of glass is required to possess high weather resistance for long-term protection against deterioration of surface quality, durability against damage and deformation, and low density with more excellence in lightweightness.

The present invention was made in consideration of those circumstances and the technical problem is to provide a cover glass for semiconductor package, which has characteristics conformable to plastic packages and always has a low emission amount of alpha-ray, and the production method thereof.

Means for Solving the Problems

The cover glass for semiconductor package of the present invention comprises, in terms of percentage by mass, from 58 to 75% of $SiO_2$, from 1.1 to 20% of $Al_2O_3$, from 0 to 10% of $B_2O_3$, from 0.1 to 20% of $Na_2O$, from 0 to 11% of $K_2O$, and from 0 to 20% of alkaline earth metal oxides, wherein the cover glass has an average thermal expansion coefficient of from 90 to $180 \times 10^{-7}/°$ C. in the temperature range of from 30 to 380° C., a Young's modulus of 68 GPa or more, and an emission amount of alpha-ray from the glass of 0.05 c/cm$^2$·hr or less.

The term "average thermal expansion coefficient" means an average thermal expansion coefficient measured with a dilatometer at a temperature range of from 30 to 380° C. The term "Young's modulus" means a value measured by the resonance method. The term "emission amount of alpha-ray" is a value measured with a super-low α-radiation measuring apparatus (LACS-4000M, manufactured by Sumitomo Chemical Co., Ltd.).

According to the construction above, the thermal expansion coefficient and the Young's modulus is conformable to plastic packages and thus warpage or deformation due to a difference in thermal expansion, cracks or abrasion of the glass, or the like hardly occur when using as a cover glass for plastic package.

Further, the present invention has a specified composition, a glass which has an excellent chemical resistance and low density can be obtained.

The cover glass for semiconductor package of the present invention preferably has a U content of 100 ppb or less and a Th content of 200 ppb or less.

According to the construction above, the emission amount of alpha-ray can be accurately reduced.

In the present invention, the cover glass preferably does not substantially contain $ZrO_2$, $As_2O_3$, and BaO.

According to the construction above, the emission amount of alpha-ray can be accurately reduced.

The cover glass for semiconductor package of the present invention preferably comprises a total amount of alkali metal oxides and alkaline earth metal oxides of from 21 to 35% by mass. The term "total amount of alkali metal oxides and alkaline earth metal oxides" means a total content of $Na_2O$, $K_2O$, $Li_2O$, CaO, MgO, SrO, and BaO.

According to the construction above, the thermal expansion coefficient of the glass can be easily increased.

The cover glass for semiconductor package of the present invention preferably has the viscosity of the cover glass at the liquidus temperature is $10^{4.7}$ dPa·s or more.

The term "liquidus temperature" means a temperature as measured in the following procedures. Firstly, each glass sample is crushed into from 300 to 500 µm of particle and then is placed on a platinum boat, followed by holding for 8 hours within a temperature gradient furnace. Then, the sample is observed with a microscope. Among the temperature at which devitrification (crystalline foreign substance) is observed inside the glass sample, the highest temperature is defined as the liquidus temperature. Further, the viscosity of the glass sample at the liquidus temperature is defined as the liquidus viscosity.

According to the construction above, the glass can be easily formed by the overflow down draw method, thereby a glass with high surface quality can be easily obtrained without polishing.

It is concerned that the conventional cover glass does not allow accurate detection of the existence of foreign substances, dusts, or the like in the imaging test before shipment or a malfunction is caused. This is assignable to the following fact. A precise polishing on the light transmissive face of the cover glass may remain numerous fine asperities (i.e., fine polishing scratches) on the surface. If an imaging test is conducted in the cover glass which has fine asperities with an electronic apparatus, the irradiating light is refracted due to the asperities on the light transmissive face of the cover glass, leading to a mixture of bright and dark regions, and which makes it difficult to accurately detect the existence of foreign substances, dusts, or the like.

To avoid this situation, the cover glass for semiconductor package preferably has an unpolished surface. The expression "having an unpolished surface" means that the glass has a surface quality acceptable as a cover glass in unpolished status. More specifically, it means that the surface roughness Ra is 1.0 nm or less. The surface roughness Ra indicates the quality of surface smoothness and can be measured by the testing method according to the JIS B0601.

According to the construction above, the cover glass has an unpolished surface, in other words, the light transmissive face has no fine asperities or grooves, so the existence of foreign substances, dusts, or the like can be accurately detected in an imaging test. Further, the malfunction of devices resulting from the scattering of incident light can be suppressed to avoid display defects. Moreover, the cover glass is unpolished and therefore there is no need to consider an emission of alpha-ray because of cerium oxide remaining on the surface of the glass.

Further, a precision polishing process can be omitted, and therefore a large-scale production with low cost can be carried out.

The cover glass for semiconductor package of the present invention preferably has a ratio by mass of $SiO_2/(Al_2O_3+K_2O)$ of from 1 to 12.

According to the construction above, weather resistance and meltability of the glass are maintained and high liquidus viscosity can be easily achieved.

The cover glass for semiconductor package of the present invention preferably has a ratio by mass of $(Na_2O+K_2O)/Na_2O$ of from 1.1 to 10.

According to the construction above, high liquidus viscosity can be easily achieved.

The cover glass for semiconductor package of the present invention is preferably used for a CMOS plastic package.

The method for producing a cover glass for semiconductor package of the present invention, comprising: preparing and melting a glass material so that the cover glass has, in terms of percentage by mass, of from 58 to 75% of $SiO_2$, of from 1.1 to 20% of $Al_2O_3$, of from 0 to 10% of $B_2O_3$, of from 0.1 to 20% of $Na_2O$, of from 0 to 11% of $K_2O$, of from 0 to 20% of alkaline earth metal oxides, wherein the cover glass has an average thermal expansion coefficient of from 90 to $180\times10^{-7}/°$ C. in the temperature range of from 30 to 380° C., and a Young's modulus of 68 GPa or more; and forming the molten glass into a sheet by using an overflow down draw method; wherein the glass material and melting facility are selected so that an emission amount of alpha-ray of the glass is 0.05 c/cm²·hr or less. The term "selection of melting facility" as used in the present invention means selecting and using a melting tank, a refining tank, or the like consisting of a material with low content of radioisotopes.

According to the construction above, the cover glass of the present invention can be easily produced.

In the method of the present invention, a material batch is preferably selected and the melting conditions are controlled so that the cover glass has a U content of 100 ppb or less and a Th content of 200 ppb or less.

According to the construction above, the emission amount of alpha-ray of the obtained glass can be accurately reduced.

In the method of the present invention, a batch which does not substantially contain $ZrO_2$, $As_2O_3$, and BaO is preferably used.

According to the construction above, the emission amount of alpha-ray of the obtained glass can be accurately reduced.

EMBODIMENT OF CARRYING OUT THE INVENTION

The cover glass of the present invention comprises, in terms of percentage by mass, from 58 to 75% of $SiO_2$, from 1.1 to 20% of $Al_2O_3$, from 0 to 10% of $B_2O_3$, from 0.1 to 20% of $Na_2O$, from 0.1 to 11% of $K_2O$, and from 0 to 20% of alkaline earth metal oxides.

Hereinafter, a description will be given as to the reason that the glass composition is defined as above. If not specified otherwise, the unit "%" as used in the description below refers to "% by mass".

$SiO_2$ is a main component for forming a network of the glass and is effective for improving the weather resistance of the glass. An extremely high content of $SiO_2$ likely lead to an increase of the high-temperature viscosity of the glass, deterioration of meltability, and an increase of the liquidus viscosity. The $SiO_2$ content is from 58 to 75%, preferably from 60 to 73%, more preferably from 62 to 69%.

$Al_2O_3$ is a component which enhances the weather resistance, liquidus viscosity, and Young's modulus of the glass. An extremely high content of $Al_2O_3$ likely lead to an increase of the high-temperature viscosity of the glass and deterioration of meltability. The $Al_2O_3$ content is from 1.1 to 20%, preferably from 1.1 to 18%, from 1.1 to 17%, from 1.1 to 17.5%, or from 3.5 to 16.5%, more preferably from 4 to 16%.

$B_2O_3$ is a component which functions as a flux, lowers the viscosity of the glass, improves meltability, and furthermore enhances the liquidus viscosity. However, an extremely high content of $B_2O_3$ likely leads to deterioration of the weather resistance of the glass. The $B_2O_3$ content is from 0 to 10%, preferably from 0 to 9%, from 0 to 8%, from 0 to 5%, from 0 to 3%, from 0 to 2%, or from 0 to 1.9%, more preferably from 0 to 1%.

The alkali metal oxides (e.g., $Na_2O$, $K_2O$, $Li_2O$, etc.) are components which lower the viscosity of the glass, improve meltability, and effectively control the thermal expansion coefficient and the liquidus viscosity. An extremely high content of these alkali metal oxides leads to significant deterioration of the weather resistance of the glass. It is therefore necessary to determine the content of these alkali meal oxides in consideration of the balance of thermal expansion coefficient and chemical durability (alkaline elution amount and weather resistance). The total content of these alkali metal oxides is preferably from 0 to 27%, from 1 to 27%, furthermore from 5 to 25%, specifically from 7 to 23%.

Among the alkali metal oxides, $Na_2O$ is effective to control the thermal expansion coefficient, and $K_2O$ is effective to increase the liquidus viscosity. Thus, the use of $Na_2O$ in combination with $K_2O$ makes it easier to control the thermal expansion coefficient and the liquidus viscosity. Accordingly, the present invention preferably comprises both $Na_2O$ and $K_2O$ as essential components. The $Na_2O$ content is from 0.1 to 20%, preferably from 3 to 18%, more preferably from 8 to 17%. The $K_2O$ content is from 0 to 11%, preferably from 0 to 9% or from 0 to 7%, more preferably from 0 to 2%, especially preferably from 0 to 1%. Further, the total content of $Na_2O$ and $K_2O$ is preferably from 4 to 22%, more preferably from 6 to 20%. The present invention may comprise $Li_2O$, with the provision that the content is controlled to from 0 to 5%, from 0 to 3%, or from 0 to 1%, specifically from 0 to 0.5%, because $Li_2O$ tends to introduce radioisotopes into the material.

In the present invention, it is easier to achieve high liquidus viscosity when the ratio by mass of $(Na_2O+K_2O)/Na_2O$ is controlled to from 1.1 to 10. The ratio of $(Na_2O+K_2O)/Na_2O$ is preferably from 1.1 to 5, more preferably from 1.2 to 3.

Further, in the present invention, the liquidus viscosity increases with a decrease of $SiO_2$ and an increase of $Al_2O_3$ and $K_2O$. Hence, when the ratio by mass of $SiO_2/(Al_2O_3+K_2O)$ is controlled to from 1 to 12, preferably from 2 to 10, it is possible to maintain the weather resistance and meltability of the glass and also achieve high liquidus viscosity.

The alkaline earth metal oxides (e.g., MgO, CaO, SrO, BaO, etc.) are components which enhance the weather resistance of the glass, reduce the viscosity, and improve the meltability. An extremely high content of these components likely lead to devitrification of the glass and an increase of the density. The total content of the alkaline earth metal oxides is from 0 to 20%, preferably from 0.5 to 18%, more preferably from 1.0 to 18%.

Incidentally, among the alkaline earth metal oxides, BaO and SrO tend to raise the density of the glass, it is preferably controlled to 12% or less, respectively, specifically 10% or less, respectively, in view of lowering the density. For the same reason, the total content of both components are preferably controlled to from 6.5 to 13%. To reduce an emission amount of alpha-ray, the content of BaO or SrO is controlled to from 0 to 3%, respectively, more preferably from 0 to 1%, respectively, even more preferably from 0 to 0.8%, respectively, most preferably from 0 to 0.5%, respectively, and if possible, it is preferable that they are not substantially contained since BaO and SrO tend to introduce radioisotopes into the material. The expression "do not substantially contain neither BaO nor SrO" as used herein means that the content of BaO or SrO in the glass composition is 0.2% or less, respectively.

In the present invention, the average thermal expansion coefficient in the temperature range of from 30 to 380° C. is from 90 to $180 \times 10^{-7}/°$ C. To achieve such a high thermal expansion coefficient, it is preferable to use a great quantity of alkali metal oxides and alkaline earth metal oxides. More specifically, the total content of alkali metal oxides and alkaline earth metal oxides is preferably from 21 to 35%, specifically from 22 to 33%. An extremely high total content of these components may cause inexpediences such as deterioration of Young's modulus and liquid viscosity.

Apart from the above-mentioned components, the present invention may contain 5% or less of $P_2O_5$, $Y_2O_3$, $Nb_2O_3$, or $La_2O_3$ within the range that does not deteriorate the characteristics of the glass. But the use of PbO or CdO which is highly toxic must be avoided.

The present invention may have any kind of refining agent at a total content of up to 3%. As the refining agent, $Sb_2O_3$, $Sb_2O_5$, $F_2$, $Cl_2$, C, $SO_3$, $SnO_2$, or metal powder such as of Al or Si can be used.

As for the $SiO_2$—$Al_2O_3$—$B_2O_3$—RO-based glass (with a composition comprising $SiO_2$, $Al_2O_3$, $B_2O_3$, and alkaline earth metal oxides as essential components) according to the present invention, as the refining agent, it is preferable to use the total content of $Sb_2O_3$ and $Sb_2O_5$ of from 0.05 to 2.0%, the total content of $F_2$, $Cl_2$, $SO_3$, C and $SnO_2$ of from 0.1 to 3.0% (specifically, comprising from 0.005 to 1.0% of $Cl_2$ and from 0.01 to 1.0% of $SnO_2$). Further, as for the $SiO_2$—$Al_2O_3$—$B_2O_3$—$R_2O$-based glass (with a composition comprising $SiO_2$, $Al_2O_3$, $B_2O_3$, and alkali metal oxides as essential components), which is excellent in meltability, it is preferable to comprise the total content of $Sb_2O_3$ and $Sb_2O_5$ of 0.2% or less and the total content of $F_2$, $Cl_2$, $SO_3$, C and $SnO_2$ of from 0.1 to 3.0%.

$As_2O_3$, which may generate a refining gas in a wide temperature range (about from 1,300 to 1,700° C.), has been widely used as a refining agent for this kind of glass conventionally, but it tends to introduce radioisotopes into the material. Further, $As_2O_3$ is highly toxic and potentially causes environmental pollution at the time of glass manufacturing process or waste glass treatment or the like. Thus, the glass substantially should not contain $As_2O_3$. $Sb_2O_3$ and $Sb_2O_5$, like $As_2O_3$, have a good refining effect, but with high toxicity. It is thus preferable that the glass substantially does not contain them, if possible. The expression "substantially does (should) not contain" as used herein means that the content of $As_2O_3$ in the glass composition is 0.1% or less, preferably 100 ppm or less; and that the content of $Sb_2O_3$ or $Sb_2O_5$ in the glass composition is 0.1% or less, respectively, preferably 0.09% or less, respectively, most preferably 0.05%, respectively.

$Fe_2O_3$ can also be used as a refining agent but colors the glass. Thus, the content thereof is controlled to preferably 500 ppm or less, more preferably 300 ppm or less, even more preferably 200 ppm or less. $CeO_2$ can also be a refining agent but colors the glass. Thus, the content thereof is controlled to preferably 2% or less, more preferably 1% or less, even more preferably 0.7% or less.

$ZrO_2$ is a component which enhances the strain point or Young's modulus of the glass but tends to introduce radioisotopes into the material. Hence, the use of $ZrO_2$ potentially has a great risk of increasing the emission amount of alpha-ray. Further, $ZrO_2$ is a component which deteriorates the devitrification resistance. In particular, when the glass is formed by the overflow down draw method, precipitation of crystals caused by $ZrO_2$ occurs in the interface between the glass and the refractory to potentially cause a deterioration of productivity in the long-term operation. Accordingly, the $ZrO_2$ content is preferably from 0 to 3%, from 0 to 2%, from 0 to 1%, from 0 to 0.5%, specifically from 0 to 0.2%, and it is preferable that the glass substantially does not contain $ZrO_2$ as possible. The expression "substantially does not contain $ZrO_2$" as used herein means that the $ZrO_2$ content in the glass composition is 500 ppm or less.

$TiO_2$ has an effect of improving the weather resistance of the glass and reducing the high-temperature viscosity, but $TiO_2$ in combination with $Fe_2O_3$ promotes the coloration of the glass due to $Fe_2O_3$, so it is preferable that the glass substantially does not contain $TiO_2$. The expression "substantially does not contain $TiO_2$" as used herein means that the $TiO_2$ content in the glass composition is 500 ppm or less. Further, when the $Fe_2O_3$ content is less than 200 ppm, the glass may contain up to 5% of $TiO_2$. But, maintaining the $Fe_2O_3$ content below 200 ppm is impractical in terms of the large amount of cost.

The cover glass for semiconductor package of the present invention with the above-specified composition easily has an average thermal expansion coefficient of from 90 to $180 \times 10^{-7}/°$ C. in the temperature range of from 30 to 380° C. Consequently, when the cover glass is sealed with the plastic package (about $100 \times 10^{-7}/°$ C.) using an adhesive consisting of an organic resin or a low melting glass, there occurs no strains inside, and excellent sealing condition is maintained for a long time. The thermal expansion coefficient of the cover glass is preferably from 90 to $160 \times 10^{-7}/°$ C., more preferably from 95 to $130 \times 10^{-7}/°$ C.

The composition range above makes it easy to obtain a glass with low density, high weather resistance, and high liquidus viscosity.

It is more preferred that the cover glass for semiconductor package of the present invention has the higher Young's modulus. More specifically, the Young's modulus of the glass is 68 GPa or more, preferably 70 GPa or more. The Young's modulus indicates how much the cover glass deforms under a given stress. The higher the Young's modulus, the less the cover glass deforms. The higher Young's modulus of the cover glass leads to protection of the semiconductor device from being affected directly by the pressure, thereby preventing damages on the semiconductor device. In the above-defined range, the higher Young's modulus of the cover glass can be achieved by reducing the content of alkali metal oxides or increasing the content of alkaline earth metal oxides, $Al_2O_3$, $B_2O_3$, or the like.

It is more preferred that the cover glass for semiconductor package of the present invention has the higher specific Young's modulus (Young's modulus/density). More specifically, the specific Young's modulus of the glass is 27 GPa/g·cm$^{-3}$ or more, preferably 28 GPa/g·cm$^{-3}$ or more. The glass with a high specific Young's modulus is satisfactory in terms of characteristics, such as lightweightness and resistance to deformation, and accordingly suitable as a cover glass for semiconductor package, particularly used in portable electronic equipment.

It is more preferred that the glass for semiconductor package of the present invention has the lower density. More specifically, the glass of which the density is 2.60 g/cm$^{-3}$ or less, particularly 2.55 g/cm$^{-3}$ or less is suitable for use in portable electronic equipment used outdoors. In other words, such equipment as video cameras, cell phones, or PDA (Personal Digital Assistant) are used outdoors and thus needed to have lightweightness and portability. In the above-defined range, the density of the glass can be lowered by, for example, reducing the content of alkaline earth metal oxides or $Al_2O_3$ or increasing the content of $B_2O_3$.

To be included in portable electronic equipment used outdoors, the cover glass is needed to have high weather resistance in addition to lightweightness and portability. In other words, it is required to have all the characteristics that it has no deterioration of surface quality when used outdoors under severe conditions. In the above-defined range, the weather resistance of the glass can be enhanced by, for example, reducing the content of alkali metal oxides.

It is more preferred that the cover glass for semiconductor package of the present invention has the higher liquidus viscosity. In case of the $SiO_2$—$Al_2O_3$—$B_2O_3$—RO (or $R_2O$)-based glass formed by the overflow down draw method, the viscosity of the glass in the formed region is approximately $10^{4.7}$ dPa·s. For that reason, the formed glass with a liquidus viscosity of about $10^{4.7}$ dPa·s or below easily occurs devitrification substances. Once devitrification substances occur in the glass, the optical transparency is deteriorated, so the glass cannot be used as a cover glass. It is therefore more preferred that the glass formed by the overflow down draw method has the higher liquidus viscosity. More specifically, the liquidus viscosity of the glass is preferably $10^{4.7}$ dPa·s or more, specifically $10^{4.7}$ dPa·s or more. In the above-defined range, the liquidus viscosity of the glass can be increased by lowering the content of $SiO_2$, alkaline earth metal oxides or the like, or increasing the content of alkali metal oxides, $Al_2O_3$, or the like.

Further, the cover glass for semiconductor package of the present invention is characterized by that the emission amount of alpha-ray from the glass is 0.05 c/cm$^2$·hr or less. The low emission amount of alpha-ray from the glass contributes to reduction of soft errors caused by alpha-ray even when the cover glass is included in a high-pixel (e.g., one million pixels or more) mini solid-state image sensing device. To achieve the emission amount of alpha-ray of 0.05 c/cm$^2$·hr or less, it is preferable to prevent incidence of impurities from the material or the melting tank and maintain the U content of 100 ppb or less and the Th content of 200 ppb or less. With an increase in the number of pixels in recent years, the solid-state image sensing device easily occurs soft errors caused by alpha-ray. Hence, the emission amount of alpha-ray from the cover glass is preferably 0.01 c/cm$^2$ or less, 0.0035 c/cm$^2$ or less, specifically 0.003 c/cm$^2$ or less. Further, the U content is preferably 20 ppb or less, 5 ppb or less, specifically 4 ppb or less; and the Th content is preferably 40 ppb or less, 10 ppb or less, specifically 8 ppb or less. As U emits alpha-ray more easily than Th, the acceptable amount of U is less than that of Th. Further, the lower emission amount of alpha-ray or the lower U or TH content can be achieved by minimizing the use of the glass material, such as $ZrO_2$ or BaO, that contains a large quantity of radioisotopes as impurities; selecting high-purity materials; constructing the inner wall of the melting furnace of a refractory with less radioisotopes; forming the glass by a method in which polishing process is unneeded (i.e., using the overflow down draw method), and the like.

It is more preferred that the cover glass for semiconductor package of the present invention has a light transmissive face which is an unpolished face. To be used without being polished, it is important to employ a forming method that allows it to directly form a glass with high surface quality, more specifically, a glass with a surface roughness (Ra) of preferably 1.0 nm or less, more preferably 0.5 nm or less, especially preferably 0.3 nm or less. Such a forming method includes the overflow down draw method. In the overflow down draw method, a glass is formed without contacting both light transmissive faces of the glass with other member and the surface of the glass becomes a surface as drawn (fire-polished surface), thereby a glass having a high surface quality as described above can be obtained without polishing. The lower surface roughness (Ra) of the light transmissive face in the cover glass leads to the higher accuracy of the imaging test for detecting foreign substances or the like and the lower incidence of malfunction of the device caused by the scattered light. In addition, high dimensional precision is required in the designs of a semiconductor package or device. A variation of the sheet thickness due to the large thickness deviation of the cover glass for semiconductor package may greatly affect the designs thereof. Further, the cover glass which is produced to have a great thickness and then polished a lot in the subsequent process may result in great expense for the production of a substrate. By the overflow down draw method, a substrate with low deviation of the sheet thickness can be produced at low cost.

The cover glass for semiconductor package of the present invention preferably has a thickness of from 0.05 to 0.7 mm. The greater thickness results in deterioration of lightweightness. The thickness greater than 0.7 mm potentially leads to display defects due to the extremely small distance with the solid-state image sensing device. Further, the thickness less than 0.05 mm leads to defection of practical strength or considerable deflection of the large-sized sheet glass, consequently with difficulty of handling. The preferred thickness is from 0.1 to 0.5 mm.

Hereinafter, a description will be given as to a method for producing a cover glass for semiconductor package of the present invention.

First, a mixture of glass materials is prepared to provide a glass with desired composition and characteristics. The desired composition and characteristics of the glass are as specified above and will not be described any more. As the glass materials, high-purity materials with a low content of impurities, such as U and Th are used, More specifically, the high-purity materials are selected so that the U content is 100 ppb or less (preferably, 20 ppb or less); and the Th content is 200 ppb or less (preferably, 40 ppb or less).

Subsequently, the mixed glass materials are put into a melting tank and melted. As the melting tank, a platinum vessel can be used, but platinum is potentially introduced into the glass and thus it is preferable that the platinum vessels are not used, if possible. When the melting tank consists of a refractory is used, at least the inner wall (i.e., ceiling, lateral face, and bottom face) of the melting tank is preferably made of a refractory with low content of U or Th. More specifically, an aluminum refractory (e.g., an alumina electrocast brick) or a quartz refractory (e.g., a silica block) is preferred, because it is resistant to erosion and has a low content of U or Th, which is 1 ppm or less, respectively, and a low elution of U or Th into the glass.

The subsequent homogenization (defoamation and striae removal) of the molten glass is carried out in a refining tank. The refining tank can be made of a refractory or platinum. Incidentally, a zirconia refractory contains a large quantity of radioisotopes, and thus, using it as a material for the inner wall of the refining tank should be avoided.

Then, the homogenized molten glass is formed into a sheet by the overflow down draw method to obtain a sheet glass with a desired thickness.

The sheet glass thus obtained is finely cut into a given dimensional size and, when necessary, is beveled to produce a cover glass.

The cover glass for semiconductor package thus produced has the above-defined basic composition and employs a melting environment arranged not to mix the high-purity materials with impurities. This makes it possible to achieve the desired characteristics and to precisely control the content of U, Th, $Fe_2O_3$, PbO, $TiO_2$, $ZrO_2$, or the like.

EXAMPLES

Hereinafter, a description will be given as to a cover glass for semiconductor package of the present invention with reference to examples.

Tables 1 and 2 show the examples (sample Nos. 1 to 11) of the cover glass for semiconductor package of the present invention.

TABLE 1

| | Sample No. | | | | | | |
|---|---|---|---|---|---|---|---|
| | 1 | 2 | 3 | 4 | 5 | 6 | 7 |
| Composition (% by mass) | | | | | | | |
| $SiO_2$ | 61.3 | 59.3 | 58.3 | 61.7 | 59.3 | 60.4 | 59.2 |
| $Al_2O_3$ | 13.00 | 15.0 | 16.0 | 15.0 | 15.0 | 17.4 | 15.0 |
| $B_2O_3$ | 2.0 | 2.0 | 2.0 | — | — | — | 2.0 |
| $Na_2O$ | 14.5 | 14.5 | 14.5 | 14.5 | 14.5 | 15.9 | 19.4 |
| $K_2O$ | 4.9 | 4.9 | 4.9 | 4.5 | 3.5 | 3.0 | — |
| MgO | 2.0 | 2.0 | 2.0 | 2.0 | 3.4 | 3.7 | 2.0 |
| CaO | 2.0 | 2.0 | 2.0 | 2.0 | 4.0 | — | 2.0 |
| $Fe_2O_3$ (ppm) | 30 | 30 | 30 | 30 | 30 | 30 | 30 |
| $SnO_2$ | 0.3 | 0.3 | 0.3 | 0.3 | 0.3 | 0.3 | 0.3 |
| U (ppb) | 4 | 3 | 3 | 3 | 2 | 6 | 5 |
| Th (ppb) | 3 | 3 | 4 | 2 | 5 | 3 | 2 |
| Density (g/cm$^3$) | 2.47 | 2.48 | 2.48 | 2.48 | 2.50 | 2.46 | 2.47 |
| Thermal expansion coefficient ($\times 10^{-7}$/° C.) | 99.2 | 99.5 | 100.0 | 99.7 | 98.1 | 103.1 | 101.5 |
| Viscosity (° C.) | | | | | | | |
| Strain point | 510 | 519 | 520 | 528 | 544 | 565 | 515 |
| Annealing point | 550 | 559 | 561 | 572 | 586 | 612 | 551 |
| Softening point | 742 | 757 | 763 | 793 | 791 | 843 | 732 |
| $10^4$ | 1146 | 1119 | 1128 | 1166 | 1125 | 1210 | 1057 |
| $10^3$ | 1339 | 1321 | 1330 | 1369 | 1310 | 1408 | 1140 |
| $10^{2.5}$ | 1463 | 1451 | 1460 | 1498 | 1429 | 1530 | 1374 |
| Liquidus temperature (° C.) | 940 | 980 | 990 | 985 | 936 | 1005 | 955 |
| Liquidus viscosity (dPa · s) | 5.3 | 5.0 | 5.0 | 5.2 | 5.6 | 5.6 | 5.0 |
| Young's modulus (GPa) | 71 | 72 | 72 | 71 | 72 | 73 | 72 |
| Rigidity modulus (GPa) | 30 | 30 | 30 | 30 | 30 | 31 | 30 |
| Emission amount of alpha-ray (c/cm$^2$ · hr) | 0.0021 | 0.0021 | 0.0021 | 0.0021 | 0.0022 | 0.0023 | 0.0021 |
| Acid resistance (g/cm$^2$) | 0.2 | 0.1 | 0.3 | 0.4 | 0.4 | 0.4 | 0.4 |

TABLE 2

| | Sample No. | | | |
|---|---|---|---|---|
| | 8 | 9 | 10 | 11 |
| Composition (% by mass) | | | | |
| $SiO_2$ | 61.3 | 58.8 | 61.5 | 59.7 |
| $Al_2O_3$ | 10.00 | 17.00 | 14.30 | 16.60 |
| $B_2O_3$ | 5.0 | 0.7 | 0.7 | 0.7 |
| $Na_2O$ | 14.5 | 15.7 | 15.7 | 15.3 |
| $K_2O$ | 4.9 | 4.0 | 4.0 | 3.9 |
| MgO | 2.0 | 3.0 | 3.0 | 3.0 |
| CaO | 2.0 | 0.5 | 0.5 | 0.5 |
| $Fe_2O_3$ (ppm) | 30 | 30 | 30 | 30 |
| $SnO_2$ | 0.3 | 0.3 | 0.3 | 0.3 |
| U (ppb) | 3 | 4 | 3 | 2 |
| Th (ppb) | 3 | 2 | 2 | 3 |
| Density (g/cm$^3$) | 2.48 | 2.47 | 2.46 | 2.46 |
| Thermal expansion coefficient ($\times 10^{-7}/°$C.) | 100.4 | 101.4 | 100.9 | 99.9 |
| Viscosity (°C.) | | | | |
| Strain point | 502 | 537 | 518 | 539 |
| Annealing point | 539 | 581 | 560 | 584 |
| Softening point | 708 | 803 | 774 | 808 |
| $10^4$ | 1027 | 1177 | 1148 | 1183 |
| $10^3$ | 1218 | 1378 | 1350 | 1385 |
| $10^{2.5}$ | 1347 | 1504 | 1480 | 1513 |
| Liquidus temperature (°C.) | 915 | 1020 | 1010 | 1020 |
| Liquidus viscosity (dPa·s) | 5.0 | 5.1 | 5.0 | 5.2 |
| Young's modulus (GPa) | 76 | 72 | 70 | 71 |
| Rigidity modulus (GPa) | 31 | 30 | 29 | 30 |
| Emission amount of alpha-ray (c/cm$^2$·hr) | 0.002 | 0.002 | 0.002 | 0.0021 |
| Acid resistance (g/cm$^2$) | 0.2 | 0.4 | 0.2 | 0.4 |

Firstly, a high-purity glass material formulated according to the composition of the tables was put into a crucible made of any one of platinum rhodium, alumina, and quartz and then melted in an electro-melting furnace having an agitation function at 1,550° C. for 6 hours. The molten glass was discharged on a carbon plate, and the plate glass was then annealed and used in various evaluations.

As can be seen from the tables, each glass sample satisfied the requirements for a cover glass for semiconductor package, in terms of density, thermal expansion coefficient, and emission amount of alpha-ray. Further, it was confirmed that the glass sample can be formed by the overflow down draw method, because the glass sample had the temperature corresponding to the viscosity of $10^{2.5}$ dPa·s of 1,520° C. or less, showing high meltability, and had a liquidus temperature of 1,025° C. or less and a liquidus viscosity of $10^{5.0}$ dPa·s or more, showing high resistance to devitrification.

The content of U or Th was measured by ICP-MASS. The density was measured by using the known Archimedes' method. The thermal expansion coefficient was determined as an average thermal expansion coefficient in the temperature range of from 30 to 380° C. using a dilatometer. The Young's modulus was measured by the resonance method. The specific Young's modulus was calculated from the Young's modulus measured by the flexural resonance method and the density. In the procedures to determine the liquidus temperature, each glass sample is crushed into from 300 to 500 μm of particle and is placed on a platinum boat, followed by holding for 8 hours within a temperature gradient furnace. Then, by the observation with a microscope, the highest temperature at which a devitrification (crystalline foreign substance) is observed inside the glass sample, was determined and was defined as the liquidus temperature. And the viscosity of the glass at the liquidus temperature was defined as the liquidus viscosity. The strain point and the annealing point were measured based on the ASTM C336-71 method, and the softening point was measured based on the ASTM C338-93 method. The $10^4$ dPa·s temperature, the $10^3$ dPa·s temperature, and the $10^{2.5}$ dPa·s temperature were determined according to the known platinum ball pulling method. The $10^{2.5}$ dPa·s temperature was the temperature corresponding to the high-temperature viscosity of $10^{2.5}$ dPa·s, and the lower this value resulted in the higher meltability. The emission amount of alpha-ray was measured with a super-low alpha-ray measuring apparatus (LACS-4000M, manufactured by Sumitomo Chemical Co., Ltd.).

As to the acid resistance, the glass sample was immersed in a 10% concentration of hydrochloric acid at 80° C. for 24 hours, and the weight of the sample changed after the testing per unit area was defined as the acid resistance.

Subsequently, each glass of Nos. 1, 2, 3, 6 and 9 of the tables 1 and 2 was melted in a melting tank (made of an alumina refractory) and formed into a sheet with thickness of 0.5 mm by using the overflow down draw method. Without polishing the surface, the sheet glass was further cut finely with a laser scriber to produce a cover glass (14 mm high and 16 mm wide) (Samples A to E). Both light transmissive faces (first and second light transmissive faces) of the cover glass thus obtained were measured in regard to surface roughness (Ra) with a stylus surface roughness tester (Talystep, manufactured by Tayler Hobson Ltd.). The results are shown in Table 3.

TABLE 3

| | Sample | | | | | |
|---|---|---|---|---|---|---|
| | A | B | C | D | E | F |
| Glass No. | 1 | 2 | 3 | 6 | 9 | 2 |
| Surface roughness (Ra) | | | | | | |
| First light transmissive face | 0.16 nm | 0.15 nm | 0.20 nm | 0.14 nm | 0.18 nm | 0.54 nm |
| Second light transmissive face | 0.18 nm | 0.20 nm | 0.18 nm | 0.18 nm | 0.16 nm | 0.95 nm |

As can be seen from Table 3, the cover glass of Examples had a surface roughness (Ra) of 0.23 nm or less for both the first and second light transmissive faces, consequently with considerably good smooth surfaces.

INDUSTRIAL APPLICABILITY

The cover glass for semiconductor package of the present invention is suitable as a cover glass for solid-state image sensing device package and, further can be used for a package holding laser diodes and any kind of semiconductor packages. Further, the cover glass has an average thermal expansion coefficient of from 90 to $180 \times 10^{-7}/°$C. in the temperature range of from 30 to 380° C. and thus can be applied to any kind of packages made of resin, cobalt alloy, molybdenum alloy, 42Ni—Fe alloy, 45Ni—Fe alloy, or the like as well as plastic packages.

While the invention has been described in detail and with reference to specific embodiments thereof, it will be apparent to those skilled in the art that various changes and modifications can be made therein without departing from the spirit and scope thereof.

This application is based on Japanese patent application No. 2010-201630 filed on Sep. 9, 2010, and the contents of which are incorporated herein by reference.

The invention claimed is:

1. A cover glass for semiconductor package, comprising, in terms of percentage by mass, from 58 to 69% of $SiO_2$, from 4 to 20% of $Al_2O_3$, from 0 to 5% of $B_2O_3$, from 0.1 to 20% of $Na_2O$, from 0.02 to 7% of $K_2O$, from 0 to 3% of $Li_2O$, from 0 to 3% BaO, from 0 to 0.5% of $ZrO_2$, and from 0 to 20% of alkaline earth metal oxides, wherein the cover glass has a ratio by mass of $(Na_2O+K_2O)/Na_2O$ of from 1.24 to 10, an average thermal expansion coefficient of from 90 to $180\times10^{-7}/°$ C. in the temperature range of from 30 to 380° C., a Young's modulus of 68 GPa or more, an emission amount of alpha-ray from the glass of 0.05 $c/cm^2 \cdot hr$ or less; and comprises a total amount of alkali metal oxides and alkaline earth metal oxides of from 21 to 35% by mass.

2. The cover glass for semiconductor package according to claim 1, wherein the cover glass has a U content of 100 ppb or less and a Th content of 200 ppb or less.

3. The cover glass for semiconductor package according to claim 1, wherein the cover glass does not substantially contain $ZrO_2$, $As_2O_3$, and BaO.

4. The cover glass for semiconductor package according to claim 1, wherein the viscosity of the cover glass at the liquidus temperature is $10^{4.7}$ dPa·s or more.

5. The cover glass for semiconductor package according to claim 1, wherein the cover glass has an unpolished surface.

6. The cover glass for semiconductor package according to claim 1, wherein the cover glass has a ratio by mass of $SiO_2/(Al_2O_3+K_2O)$ of from 2.148 to 12.

7. The cover glass for semiconductor package according to claim 1, wherein the cover glass has a ratio by mass of $(Na_2O+K_2O)/Na_2O$ of from 1.24 to 3.

8. A complementary metal oxide semiconductor (CMOS) plastic package comprising the cover glass for semiconductor package according to claim 1.

9. A method for producing a cover glass for semiconductor package, comprising:
preparing and melting a glass material so that the cover glass has, in terms of percentage by mass, from 58 to 69% of $SiO_2$, from 4 to 20% of $Al_2O_3$, from 0 to 5% of $B_2O_3$, from 0.1 to 20% of $Na_2O$, from 0.02 to 7% of $K_2O$, from 0 to 3% of $Li_2O$, from 0 to 3% BaO, from 0 to 0.5% of $ZrO_2$, and from 0 to 20% of alkaline earth metal oxides, wherein the cover glass has a ratio by mass of $(Na_2O+K_2O)/Na_2O$ of from 1.24 to 10, an average thermal expansion coefficient of from 90 to $180\times10^{-7}/°$ C. in the temperature range of from 30 to 380° C., a Young's modulus of 68 GPa or more, and comprises a total amount of alkali metal oxides and alkaline earth oxides of from 21 to 35% by mass; and
forming the molten glass into a sheet by using an overflow down draw method;
wherein the glass material and melting facility are selected so that an emission amount of alpha-ray of the glass is 0.05 $c/cm^2 \cdot hr$ or less.

10. The method according to claim 9, wherein a material batch is selected and the melting conditions are controlled so that the cover glass has a U content of 100 ppb or less and a Th content of 200 ppb or less.

11. The method according to claim 9 or 10, wherein a batch which does not substantially contain $ZrO_2$, $As_2O_3$, and BaO is used.

12. The method according to claim 9, wherein the viscosity of the cover glass at the liquidus temperature is $10^{4.7}$ dPa·s or more.

13. The method according to claim 9, wherein the cover glass has an unpolished surface.

14. The method according to claim 9, wherein the cover glass has a ratio by mass of $SiO_2/(Al_2O_3+K_2O)$ of from 2.148 to 12.

15. The method according to claim 9, wherein the cover glass has a ratio by mass of $(Na_2O+K_2O)/Na_2O$ of from 1.24 to 3.

16. The method according to claim 9, wherein the cover glass is used for a CMOS plastic package.

17. The cover glass for semiconductor package according to claim 1, wherein the cover glass has from 0 to 3% of SrO.

18. The method according to claim 9, wherein the cover glass has from 0 to 3% of SrO.

19. The cover glass for semiconductor package according to claim 1, wherein the cover glass has from 0 to 3% of SrO and a ratio by mass of $(Na_2O+K_2O)/Na_2O$ of from 1.24 to 3.

* * * * *